(12) United States Patent
Dunnihoo et al.

(10) Patent No.: US 8,351,170 B2
(45) Date of Patent: Jan. 8, 2013

(54) IMPEDANCE COMPENSATED ELECTROSTATIC DISCHARGE CIRCUIT FOR PROTECTION OF HIGH-SPEED INTERFACES AND METHOD OF USING THE SAME

(75) Inventors: Jeffrey C. Dunnihoo, Bertram, TX (US); Richard Kimoto, Fremont, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 269 days.

(21) Appl. No.: 12/332,159

(22) Filed: Dec. 10, 2008

(65) Prior Publication Data

US 2009/0154038 A1 Jun. 18, 2009

Related U.S. Application Data

(60) Provisional application No. 61/007,298, filed on Dec. 11, 2007.

(51) Int. Cl.
*H02H 9/00* (2006.01)
(52) U.S. Cl. .......................................... 361/56

(58) Field of Classification Search ................ 361/56, 361/54, 111, 119, 91.1, 91.5, 91.6; 327/310, 327/324, 309, 314; 333/17.2, 17.3, 32, 33
See application file for complete search history.

(56) References Cited

U.S. PATENT DOCUMENTS

| | | | |
|---|---|---|---|
| 5,386,335 A * | 1/1995 | Amano et al. | 361/56 |
| 5,969,929 A | 10/1999 | Kleveland et al. | |
| 6,208,225 B1 * | 3/2001 | Miller | 333/202 |
| 6,329,223 B2 * | 12/2001 | Yu | 438/123 |
| 6,448,865 B1 * | 9/2002 | Miller | 333/33 |
| 6,476,472 B1 * | 11/2002 | Davison et al. | 257/678 |
| 6,509,779 B2 * | 1/2003 | Yue et al. | 327/310 |
| 6,549,114 B2 * | 4/2003 | Whitney et al. | 338/21 |
| 6,614,633 B1 * | 9/2003 | Kohno | 361/56 |
| 6,859,915 B1 | 2/2005 | Frank et al. | |
| 6,982,859 B1 * | 1/2006 | Whitney | 361/111 |
| 7,145,413 B2 * | 12/2006 | Hsu et al. | 333/33 |
| 7,555,048 B1 * | 6/2009 | Massoumi et al. | 375/260 |
| 8,021,918 B2 * | 9/2011 | Lin et al. | 438/106 |
| 2006/0082938 A1 * | 4/2006 | Ochoa et al. | 361/56 |
| 2007/0058308 A1 * | 3/2007 | Thijs et al. | 361/56 |

* cited by examiner

*Primary Examiner* — Stephen W Jackson

(57) ABSTRACT

The embodiments of the apparatus and method described herein provide an integrated ESD/EOS protection solution which simplifies system PCB design for signal integrity compliance. As part of providing this solution, it is also desired to implement improved ESD/EOS protection and improved PCB routing.

20 Claims, 7 Drawing Sheets

Flow Through "Single Ended" Clamp

DUT In Parallel With DUP

Flow Through "Single Ended" Clamp

Signal Under

Signal Through

Flow Through "Differential" Clamp

IMPEDANCE COMPENSATED ELECTROSTATIC DISCHARGE CIRCUIT FOR PROTECTION OF HIGH-SPEED INTERFACES AND METHOD OF USING THE SAME

The present invention claims priority to U.S. Provisional Application No. 61/007,298, filed Dec. 11, 2007, entitled "Impedance Compensated ESD Protection For High-Speed Interfaces," which application is expressly incorporated by reference herein.

FIELD OF THE INVENTION

The present invention relates to an impedance compensated ESD circuit for protection for high-speed interfaces and a method of using the same

BACKGROUND OF THE INVENTION

Various companies currently have electronic systems with multiple high-speed—I/O interfaces in development. These systems and interfaces must meet various industry standard signal integrity specifications, such as, for instance for the HDMI standard there is an HDMI compliance specification. Additionally, there are also industry wide ESD/EOS (electrical overstress) survivability ratings. The target signal integrity requirement for many of these systems ensures system interoperability via BERT testing, eye-diagram masks, or passive TDR transmission line analysis.

A simplified example of a conventional system that implements ESD/EOS protection is illustrated in FIG. 1. It is noted that the system shown below could utilize typical shunt-type ESD clamps, or series-type ESD protection where the signals come in one side, and come out geometrically identical on the other side. The objective of these high-speed applications is to include the ESD protection without inserting an appreciable impedance discontinuity along the transmission line from the connector (P1) to the receiver or transmitter ASIC (DUP).

Conventional systems have a Device under Protection (DUP) and a Device under Test (DUT), in which there is a "shunt-architecture" in which the ESD Products have DUT in parallel with DUP. In a conventional ESD structure with a diode, one terminal is corrected to the signal line and the other terminal is connected to Ground. Therefore, in such a configuration, the ESD diode is always in parallel with the DUP. In these existing devices, such as a CM1213 from CMD, series parasitic resistance and inductance of the DUT work against drawing ESD current away from the DUP, and the parallel parasitic capacitance creates an impedance discontinuity in the frequency band of interest.

In conventional DUT's the chip bondwire and other parasitic inductance presents a high impedance at high frequencies and fast pulse edge rates (ie. during an ESD event). The amount of current drawn away from the DUP is hindered by the bondwire and these parasitic elements. As a result, the DUP is still largely directly exposed to the ESD threat, as illustrated below.

In-band, the parasitic capacitive load of the ESD clamp circuit, shown here as C(PAR), can drop the impedance of the transmission line form the connector to the ASIC (DUP) in the vicinity of the ESD DUT. To offset this, standard practice is to adjust (typically increase) the characteristic impedance of the transmission lines around the vicinity of the DUT to offset this (typically lower) impedance discontinuity of the ESD DUT placement.

SUMMARY OF THE INVENTION

An objective of the present invention is to provide an integrated ESD/EOS protection solution which simplifies system PCB design for signal integrity compliance.

As part of providing this solution, it is also desired to implement improved ESD/EOS protection and improved PCB routing.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

Figure 1:
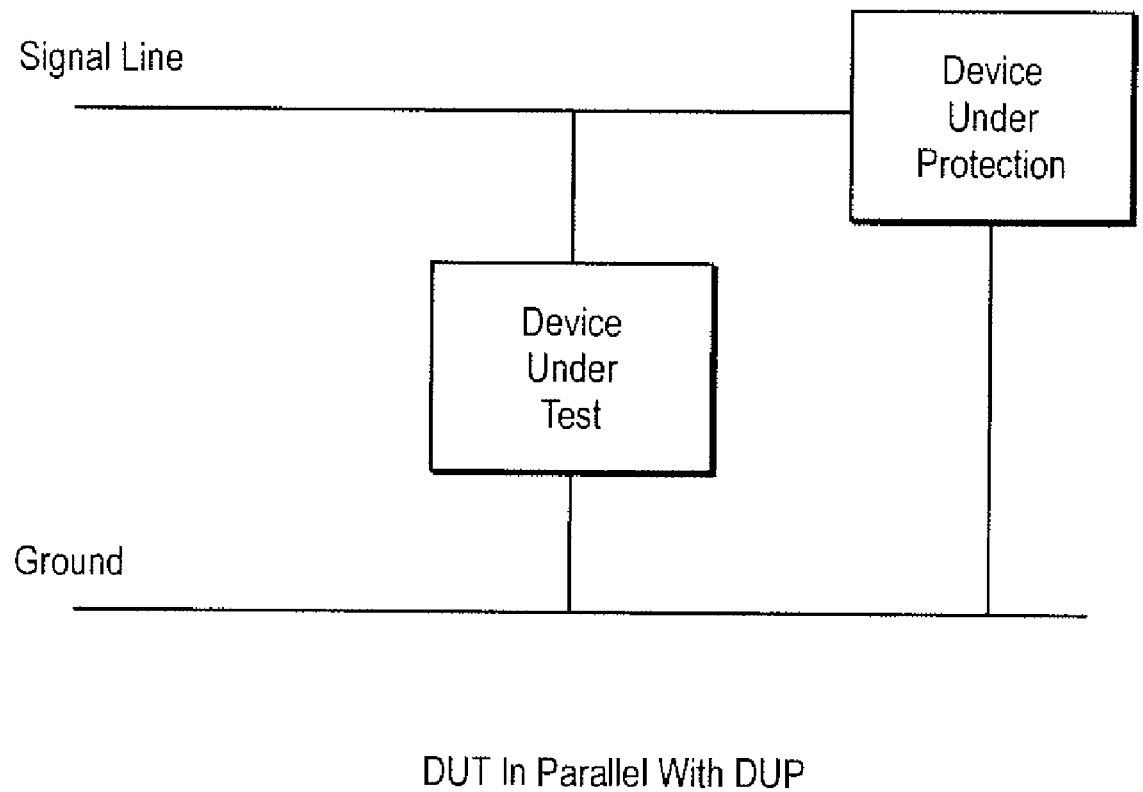
FIG. 1 illustrates a conventional parallel ESD connection.
Figure 2:
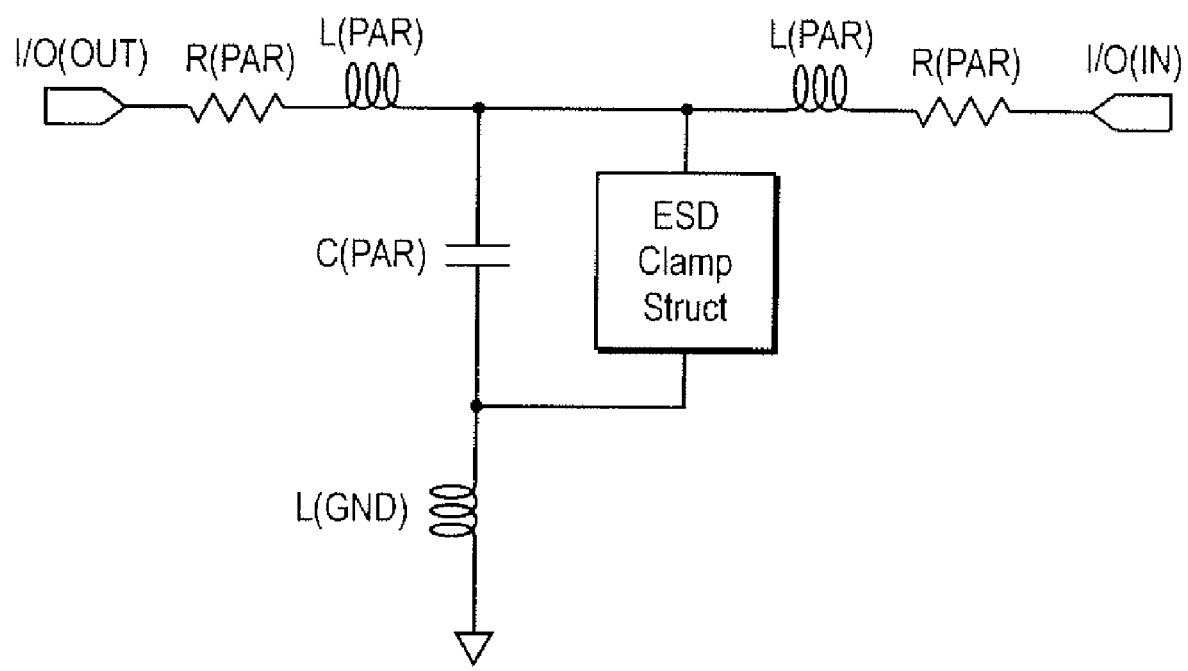
FIG. 2 illustrates a series ESD connection according to an embodiment of the invention.

In the system according to the present invention, as shown in FIG. 2, the DUT is in series with DUP. As a result, the ESD Event must pass through DUT before getting to the DUP. Further, parasitic series inductance and resistance work with DUT to reduce current into DUP.

With this "flow through" topology, it is possible to perform the above pre-compensation wholly within the ESD DUT packaging in the frequency band of interest, thus eliminating the need for "tuning" of the system PCB. This gives the advantage of simplifying the PCB design, and reducing time to market. While series connections of a DUP with EMI filtering devices are known, such EMI filtering devices are intended to filter out unwanted signals in the high frequency domain. In contrast, with the DUT of the present invention, high frequency signals are passed without degradation.

Figure 3A:
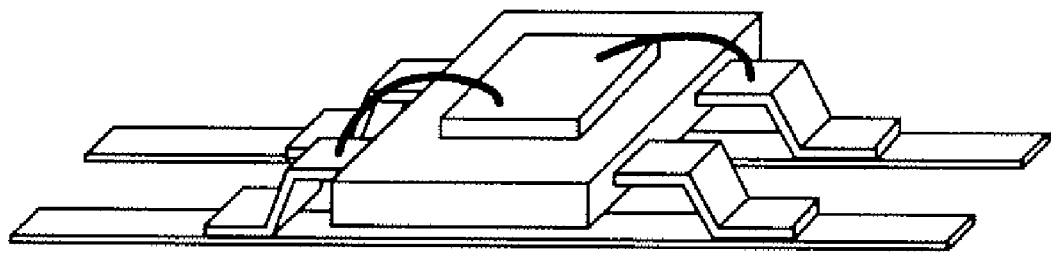
FIGS. 3a-b respectively illustrate a conventional under ESD connection and a through ESD connection according to the present invention.
Figure 3B:
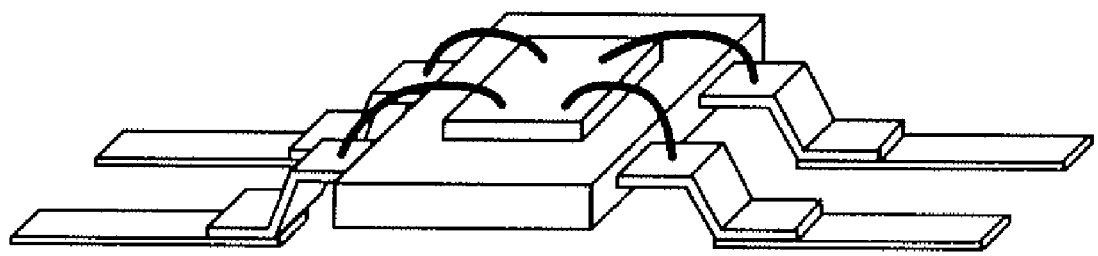

The DUT according to the present invention, illustrated in a single channel implementation in FIG. 2, can more generally be described as a shunt-type ESD clamp incorporated within a series "T-network" as shown below. For clarity of terms, the bi-directional I/O lines are labeled as "OUT" toward the connector and "IN" toward the ASIC (DUP). The physical implementation of this "single ended" clamp is shown in FIG. 3b which, as shown, does not allow the signal to go under the ESD device (as shown in FIG. 3a but instead the signal goes through the ESD device, as is shown, with the signal PCB trace not being a single line. As is shown, therefore, the bondwires themselves on either side of the ESD device are the "L(PAR)" as shown in the above diagram.

Figure 5:
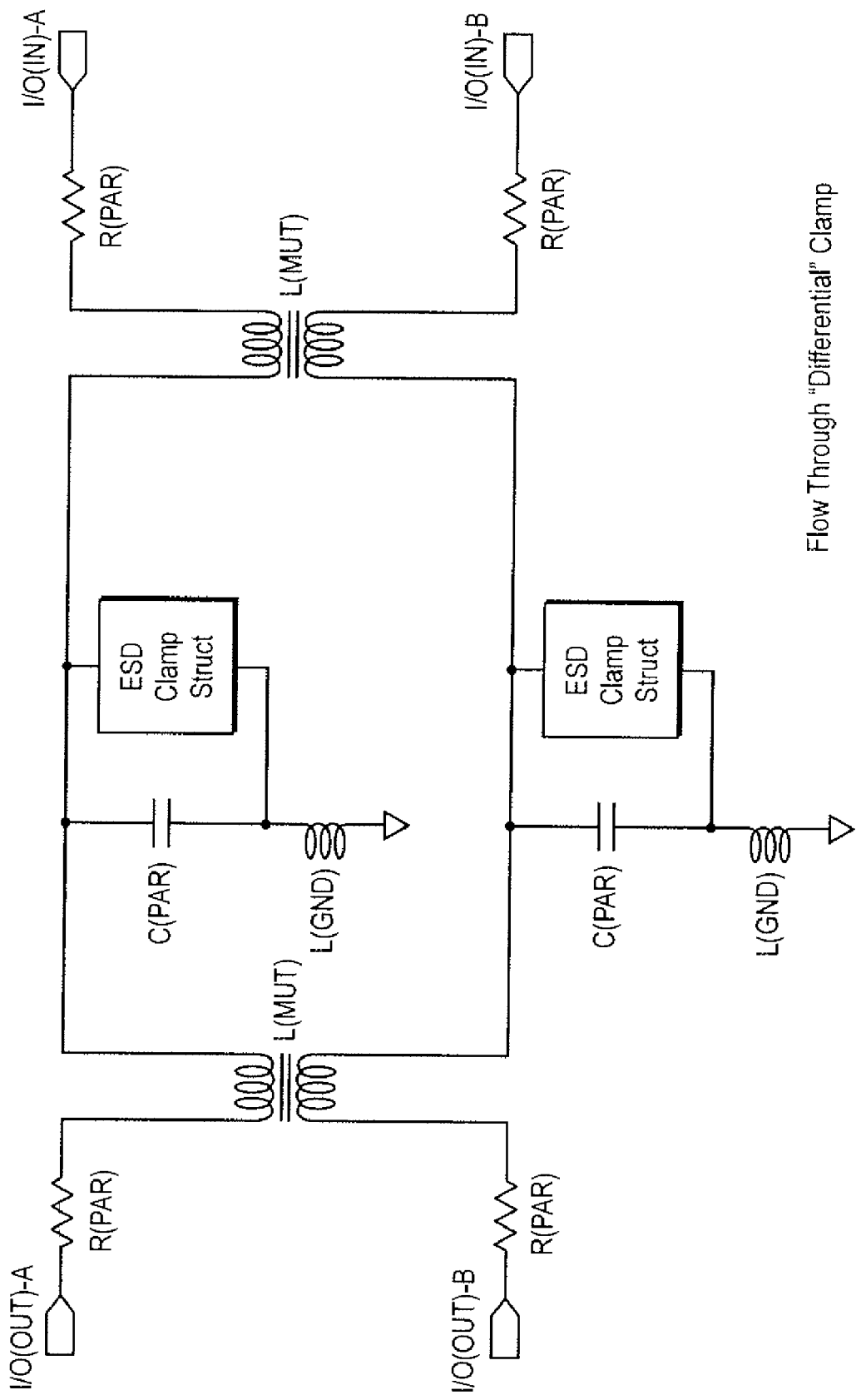
FIG. 5 illustrates a differential pair implementation according to the present invention.

In addition, by integrating these stages into a single package a number of improvements are gained over a similar solution made from discrete components. The first advantage is that the differences due to process and other variations between one channel to another can be tightly matched. This minimizes the negative effects that mismatch presents on solutions where signal integrity is important. For example, the two channels with minimized mismatch may make up a differential pair, as shown in FIG. 5. The lower mismatch will reduce signal skew and reflections presented by the DUT. An additional advantage is that board space and thus cost can be reduced as compared to a discrete solution.

Figure 4:
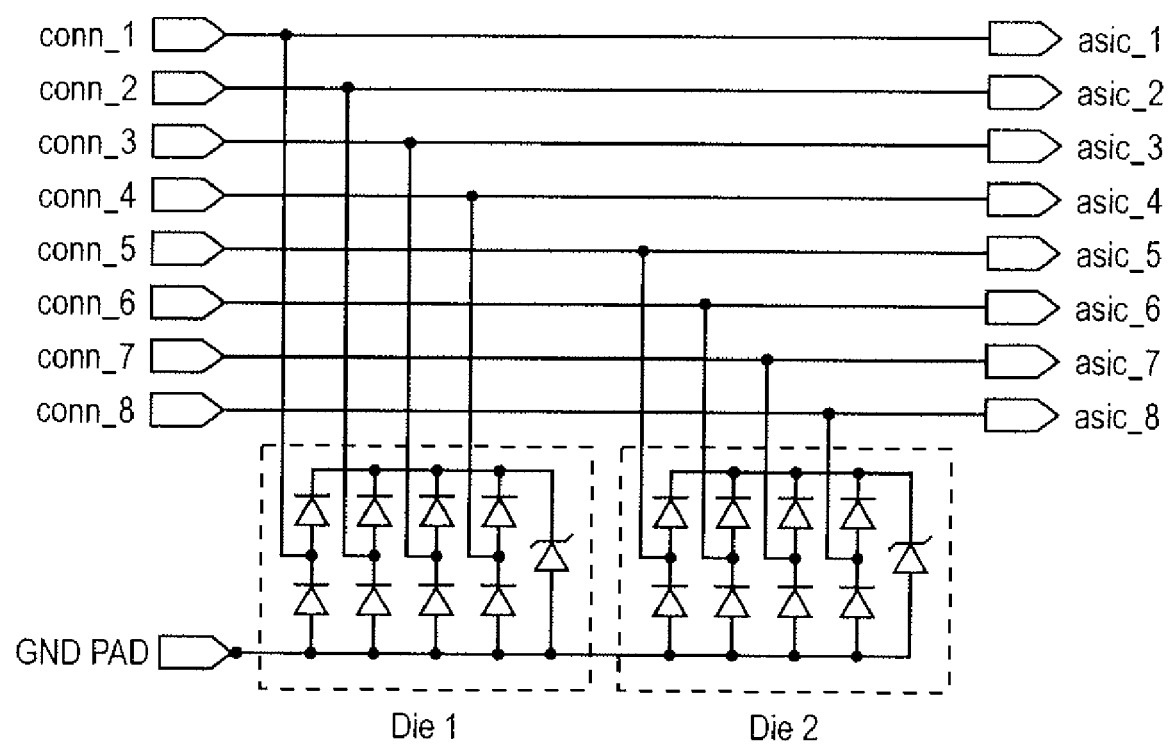
FIG. 4 illustrates a specific implementation of the present invention using diodes.

In a single channel implementation as shown in FIG. 2, the parasitic inductance of the semiconductor packaging can be used for the series element, in conjunction with other elements designed into the semiconductor die circuit. The "ESD clamp structure" according to the present invention, in one embodiment, are ESD diode(s), as shown in FIG. 4, in a configuration having 8 different lines that allow for ESD protection.

With this specific integrated circuit ESD device as shown above, in combination with the bondwires that act as parasitic inductors as explained previously, the present invention operates as a clamp structure, but one that includes the PCB traces that are configured as described, the bond wires, as well as the ESD diode(s) as illustrated here. The series elements could also be an inductor, transformer, common mode filter, or even a capacitor+inductor combination for an AC coupled bandpass filter. As noted herein, the series inductance parasitics of the package dominate with respect to the embodiments described herein, and while such dominating inductance parasitics are normally undesirable (as these become unwanted packaging detractions), these dominating inductance parasitics are advantageously used herein. Thus, if a large inductor was integrated on-chip, then the dominating inductance parasitics would become negligible, and in fact would allow a reduction in package size, reducing cost. The implementation shown below can provide the improved impedance matching, along with enhanced common-mode EMI rejection and filtering within the same package.

Aspects of the present invention include the usage of series elements, flow-through routing and distributed ESD stages.

With respect to series elements, inductance presents high impedance at high frequencies and fast pulse edge rates (ESD event), limiting current and voltage to the DUP, and the resistance drops or attenuates a high voltage at high current, reducing the voltage observed at the DUP. At low signal currents during normal operation, the resistance creates some signal attenuation in the pass-band, reducing available signal, but at acceptable levels within the interface devices recovering sensitivity or transmit level requirements such that the overall system still meets signal integrity requirements.

Figure 6:
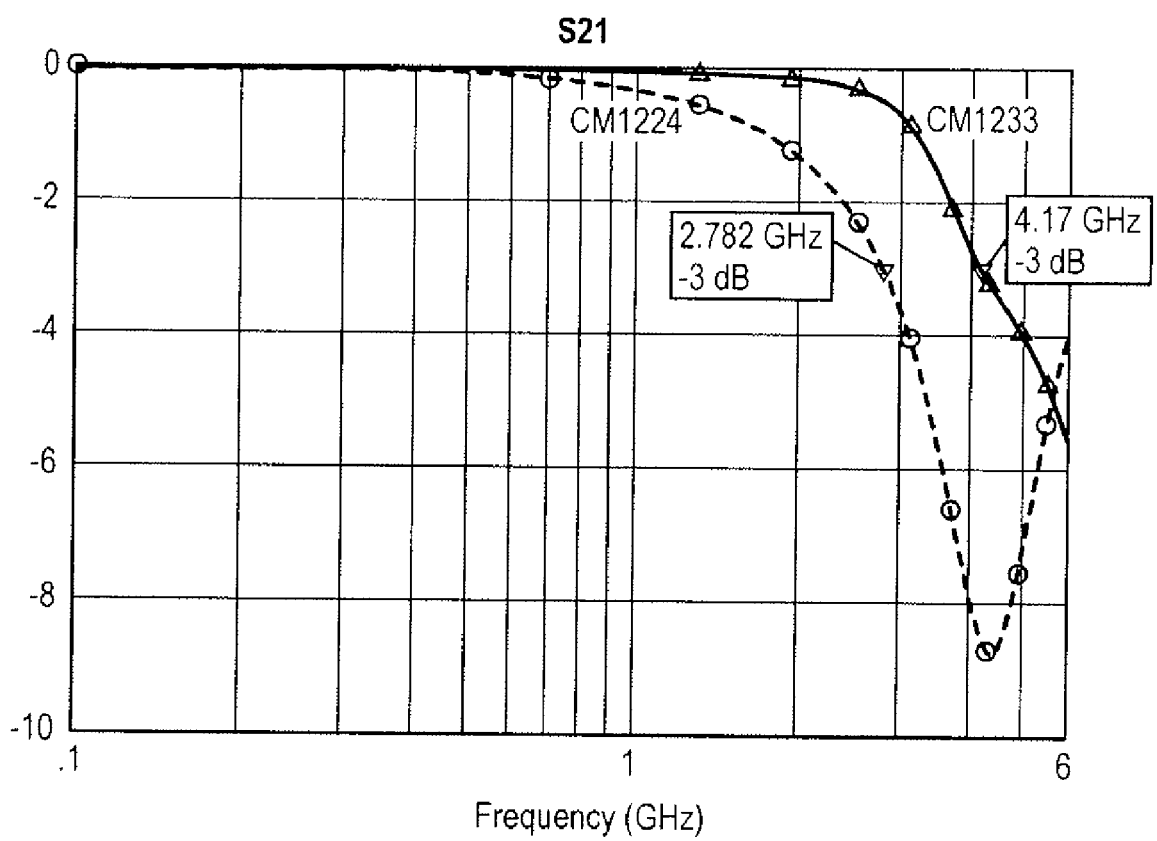
FIG. 6 illustrates a spectrum plot that shows the advantages of the flow-through approach according to the present invention.
Figure 7:
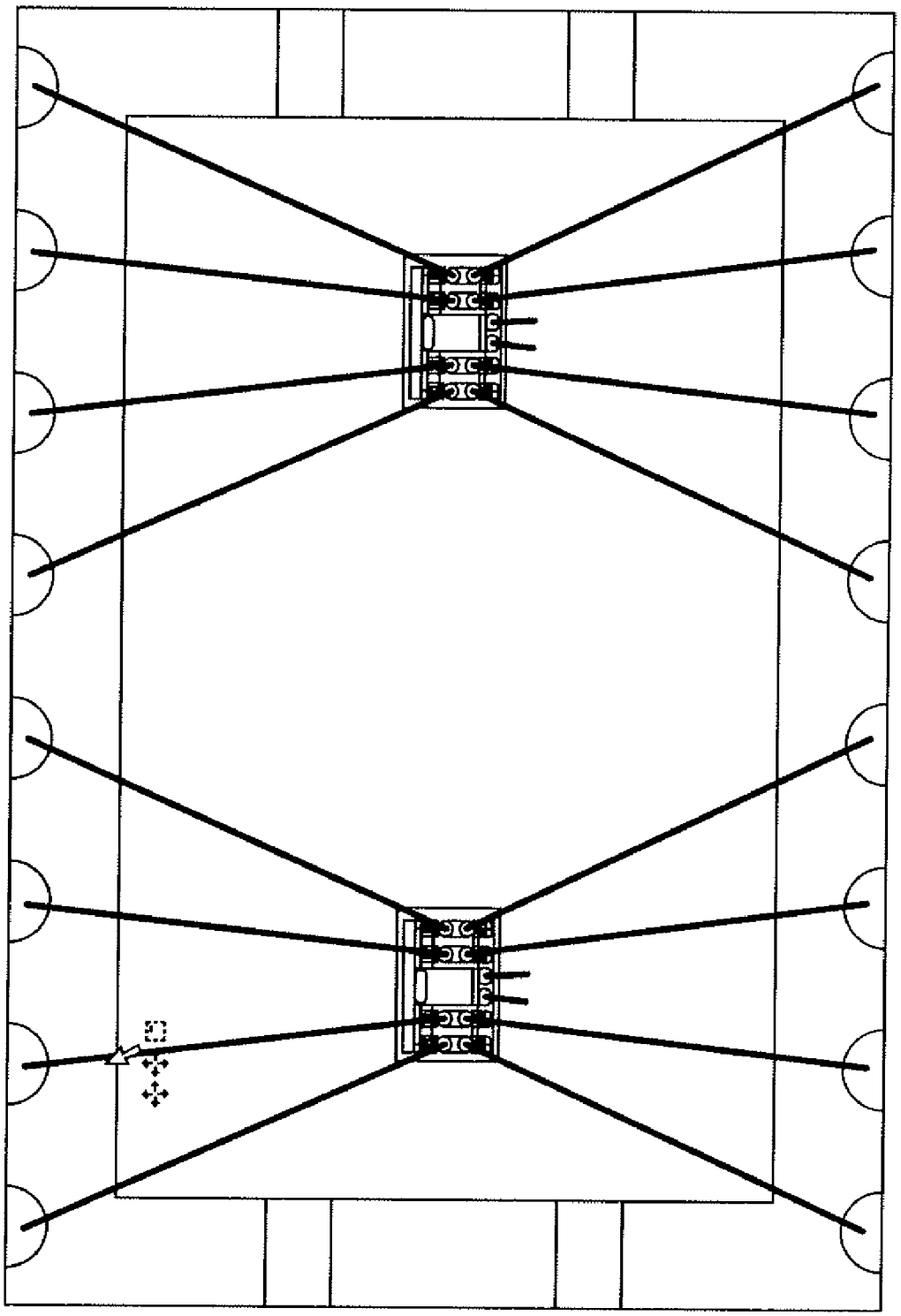
FIG. 7 illustrates a specific implementation of the present invention using the FIG. 4 c circuit.

With respect to flow-through routing, packaging bondwires don't hinder ESD protection, they help. Specifically, packaging bondwires can be used (as is shown in FIG. 3B) to tune the transmission line's impedance (i.e. cancel effect of ESD stage capacitance), which improves signal integrity by making the DUT more transparent Distributed ESD Stages (multiple stages). In particular, based upon the flow-through approach as described above, the present invention uses a different approach with respect to PCB traces than conventional. In particular, rather than having PCB traces run physically under (and electrically parallel to) the ESD device as is conventionally done, in the present invention the PCB trace does not run under the ESD devices, so that the signal instead that is on the PCB trace must run through the ESD device. This approach thus places bondwire inductance in series with the traces, and the series inductance acts to cancel undesired capacitance and therefore widens the spectrum of the signal passband. This can be seen from the spectrum plot shown in FIG. 6. In this example the bandwidth is widened from 2.7 Ghz (conventional shunt type architecture) to 4.2 Ghz (new flow through architecture). Further, channel to channel signal variations are minimized. As is shown in FIG. 7, which is a specific implementation at a physical level showing the bondwire connections for the 8 different lines shown in the schematic of FIG. 4, while there are channel to channel variations in the impedance, these are systematic—so that although middle pairs will have slightly different impedance than outer pairs, the difference can be predetermined, minimized, and easily characterized.

Still furthermore, when the various connections are used to drive differential signals, it is important that the bond wire lengths (i.e. inductances) match each other, in order to minimize any intra-pair skew. In addition it is important to minimize the skew between different pairs. Therefore if several signal pairs are present, it may be desirable to have several dice in one package, as is shown in FIG. 7. Further, it is noted that the series inductance of the bondwires, and thus the difference in parasitic inductance, from channel to channel, is proportional to the differences in bondwire length.

With this configuration, the differential impedance is the same for each channel.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed is:

1. An apparatus for transmitting a signal and discharging an electrostatic discharge (ESD) event pulse associated with an ESD event to ground to protect a device under protection comprising:
   a printed circuit board ("PCB") having a PCB trace line that transmits the signal, the PCB trace line being formed of first and second line portions that are electrically isolated from one another; and
   an electrostatic discharge protection device, separate from the device under protection, and mounted on the printed circuit board to protect the device under protection from the ESD event and for transmitting the signal from the first line portion to the second line portion, the electrostatic discharge protection device including predetermined device parasitics that have an inductance/capacitance ratio that match a PCB trace inductance/capacitance ratio, the electrostatic discharge protection device further including:
      an integrated semiconductor, the integrated semiconductor including:
         an input pad adapted for electrical coupling to the first line portion of the printed circuit board, that receives the signal and the ESD event pulse associated with the ESD event;
         an output pad adapted for electrical coupling to the second line portion of the printed circuit board; and
         an electrostatic discharge circuit connected between the input pad and the output pad, the electrostatic discharge circuit providing an electrical path for the signal from the input pad to the output pad and dissipating the ESD event pulse by providing a path to the ground.

2. The apparatus according to claim 1 wherein the inductance/capacitance ratio of the device parasitics is adjusted using first and second bondwires that electrically connect the input pad to the first line portion and the output pad to the second line portion, respectively.

3. The apparatus according to claim 2, wherein the first and second bondwires are configured to have a parasitic inductance that cancels undesired capacitance that exists from the PCB trace line.

4. The apparatus according to claim 2 wherein a plurality of PCB traces are provided that provide a plurality of channels, and wherein a plurality of bondwires are matched with each other to assist in maintaining the device parasitics that have the inductance/capacitance that matches the PCB trace inductance/capacitance ratio.

5. The apparatus according to claim 1 wherein the inductance/capacitance ratio of the device parasitics is adjusted using the electrostatic discharge circuit.

6. A method of providing impedance compensated electrostatic discharge (ESD) protection for high-speed interfaces comprising:
determining an inductance-to-capacitance characteristic impedance ratio of traces on a printed circuit board ("PCB"), the PCB traces to configured to conduct electric signals across the PCB;
mounting an ESD protection circuit on the PCB connected in series in a PCB trace pathway between a device under protection and the high-speed interface such that a received signal flows through the ESD protection circuit before reaching the device under protection;
adjusting the electrical parasitics of the ESD protection circuit so that its characteristic impedance ratio is compensated to match the characteristic impedance ratio of the PCB traces,
wherein the ESD circuit is operative to permit high frequency components of the received signal to flow through the ESD circuit from the high-speed interface to the device under protection while dissipating any ESD event pulses by providing a path to the ground.

7. The method according to claim 6 wherein the PCB traces include first and second line portions that are electrically isolated from one another, and the ESD protection circuit includes first and second bondwires that electrically connect an input pad of the ESD circuit to the first line portion and an output pad of the ESD circuit to the second line portion, respectively.

8. The method according to claim 7, wherein the first and second bondwires are configured to have a parasitic inductance that cancels undesired capacitance that exists from the PCB trace line.

9. The method according to claim 7 further comprising matching a plurality of bondwires of a plurality of PCB traces with each other to assist in maintaining the ESD circuit parasitics that have the characteristic impedance ratio equal to the characteristic impedance ratio of the PCB traces.

10. The method according to claim 9 wherein the L/C characteristic impedance ratio of the ESD circuit parasitics is adjusted using the ESD protection circuit.

11. A system for transmitting signals and discharging an electrostatic discharge (ESD) event pulse associated with an ESD event to ground to protect an integrated circuit device under protection comprising:
a printed circuit board ("PCB") carrying a plurality of devices including the device under protection and an electrostatic discharge protection device separate from the device under protection, the printed circuit having a plurality of PCB trace lines that transmits signals between the plurality of devices, wherein at least one PCB trace line is formed of first and second line portions that are electrically isolated from one another,
wherein the electrostatic discharge protection device protects the device under protection from the ESD event and is adapted to transmit the signal from the first line portion to the second line portion,
wherein the electrostatic discharge protection device includes predetermined device parasitics that have an inductance/capacitance ratio that match inductance/capacitance ratio of the at least one PCB trace line, and
wherein the electrostatic discharge protection device comprises an integrated circuit having:
an input pad adapted for electrical coupling to the first line portion on the printed circuit board that receives the signal, and the ESD event pulse associated with the ESD event;
an output pad adapted for electrical coupling to the second line portion of the printed circuit board; and
an electrostatic discharge circuit connected between the input pad and the output pad, the electrostatic discharge circuit providing an electrical path for the signal from the input pad to the output pad and dissipating the ESD event pulse by providing a path to the ground.

12. The system according to claim 11 wherein the inductance/capacitance ratio of the device parasitics is adjusted using first and second bondwires that electrically connect the input pad to the first line portion and the output pad to the second line portion, respectively.

13. The system according to claim 12, wherein the first and second bondwires are configured to have a parasitic inductance that cancels undesired capacitance of the PCB trace line.

14. The system according to claim 12 wherein the plurality of PCB trace lines provide a plurality of channels, and wherein a plurality of bondwires are matched with each other to assist in maintaining the device parasitics that have the inductance/capacitance that matches a PCB trace inductance/capacitance ratio associated with the plurality of PCB trace lines.

15. The system according to claim 11 wherein the inductance/capacitance ratio of the device parasitics is adjusted using the electrostatic discharge circuit.

16. The method according to claim 6, further comprising:
mounting the device under protection on the PCB; and
mounting the ESD circuit on the PCB.

17. The method according to claim 16 wherein the step of providing provides the compensated ESD circuit device using first and second bondwires that electrically connect an input pad to a first line portion and an output pad to a second line portion, respectively.

18. The method according to claim 17, wherein the first and second bondwires are configured to have a parasitic inductance that cancels undesired capacitance that exists from the PCB trace line.

19. The method according to claim 17 wherein the step of providing provides a plurality of PCB traces with a plurality of channels, and wherein a plurality of bondwires are matched with each other to assist in maintaining the device parasitics that have the L/C characteristic impedance ratio that matches the Lo/Co characteristic impedance ratio of the PCB traces.

20. The method according to claim 19 wherein the L/C characteristic impedance ratio of the device parasitics is adjusted using the electrostatic discharge circuit.

* * * * *